US006950461B2

(12) United States Patent
Goldstein et al.

(10) Patent No.: US 6,950,461 B2
(45) Date of Patent: Sep. 27, 2005

(54) MODEMS UTILIZING LOW DENSITY PARITY CHECK CODES

(75) Inventors: Yuri Goldstein, Southbury, CT (US); Yuri Okunev, Southbury, CT (US)

(73) Assignee: PCTel, Inc., Milpitas, CA (US)

( * ) Notice: Subject to any disclaimer, the term of this patent is extended or adjusted under 35 U.S.C. 154(b) by 616 days.

(21) Appl. No.: 09/961,839

(22) Filed: Sep. 24, 2001

(65) Prior Publication Data

US 2002/0186759 A1 Dec. 12, 2002

Related U.S. Application Data

(63) Continuation-in-part of application No. 09/893,383, filed on Jun. 27, 2001, now Pat. No. 6,567,465.

(60) Provisional application No. 60/292,433, filed on May 21, 2001.

(51) Int. Cl.[7] .............................. H04B 1/38; H04L 5/16

(52) U.S. Cl. ........................ 375/222; 375/259; 714/758

(58) Field of Search ................................. 375/222, 259; 714/762, 788, 766, 755–758, 6, 7, 752, 768, 801–805

(56) References Cited

U.S. PATENT DOCUMENTS

| | | | | |
|---|---|---|---|---|
| 4,295,218 A | * | 10/1981 | Tanner | 714/762 |
| 6,138,125 A | * | 10/2000 | DeMoss | 707/202 |
| 6,633,856 B2 | * | 10/2003 | Richardson et al. | 706/15 |
| 6,718,508 B2 | * | 4/2004 | Lodge et al. | 714/780 |
| 2002/0042899 A1 | * | 4/2002 | Tzannes et al. | 714/786 |
| 2003/0033570 A1 | * | 2/2003 | Khannanov et al. | 714/755 |

OTHER PUBLICATIONS

R.G. Gallager, "Low–Density–Parity–Check Codes", MIT Press, Cambridge, MA 1963.

D.J.C. MacKay and R.M. Neal, "Near Shannon limit performance of LDPC codes", Electron. Letters, vol. 32, No. 18, Aug. 1996.

(Continued)

*Primary Examiner*—Phuong Phu
(74) *Attorney, Agent, or Firm*—Gordon & Jacobson, PC

(57) ABSTRACT

A modem includes an LDPC encoder which utilizes a deterministic H-matrix, optionally via a generation matrix, to generate redundant parity bits for a bit block. Ones are placed into the H-matrix in a completely diagonal manner with diagonals subdivided into sets of diagonals. The first diagonal in each set i begins with coordinates H(1,k), where $k=(1+(i*M_j))$. The remaining diagonals in the sets are offset from the first diagonals so that the column distances between any two pairs of diagonals is unique. In another embodiment, the H-matrix is determined by assigning "1s" in a first column, and then assigning "1s" of subsequent columns deterministically by causing each "1" in a previous ancestor column to generate a "1" in the next descendant column based on the rule that a descendant is placed one position below an ancestor except where rectangles would be generated. Interrupted descending diagonals are generated.

20 Claims, 10 Drawing Sheets

OTHER PUBLICATIONS

D.J.C. MacKay, "Good Error–Correcting Codes Based on Very Sparse Matrices", IEEE Transactions on Information Theory, vol. 45, No. 2, Mar. 1999.

D.J.C. MacKay, Simon T. Wilson, and Matthew C. Davey, "Comparison of Constructions of Irregular Gallager Codes", IEEE Transactions on Communications, vol. 47, No. 10, Oct. 1999.

Marc P.C. Fossorier, Miodrag Michaljevic, and Hideki Imai, "Reduced Complexity Iterative Decoding of LDPC Codes Based on Belief Propagation", IEEE Transactions on Communications, vol. 47, NO. 5, May 1999.

E. Eleftheriou, T. Mittelholzer, and A. Dholakia, "Reduced-complexity decoding algorithm for LDPC codes", Electron. Letter, vol. 37, Jan. 2001.

IBM Corp., "LDPC codes for G.dmt.bis and G.lit.bis", ITU—Telecommunication Standardization Sector, Document CF–060, Clearwater, Florida, Jan. 8–12, 2001.

Aware, Inc., "LDPC Codes for ADSL", ITU–Telecommunication Standardization Sector, Document BI–068, Bangalore, India, Oct. 23–27, 2000.

IBM Corp., Globespan, "G.gen: G.dmt.bis: G.Lite.bis: Reduced–complexity decoding algorithm for LDPC codes", ITU–Telecommunnication Standardization Sector, Document IC–071, Irvine, California, Apr. 9–13, 2001.

IBM Corp., "LDPC codes for DSL transmission", ITU—Telecommunication Standardization Sector, Document BI–095, Bangalore, India, Oct. 23–27, 2000.

IBM Corp., "LDPC coding proposal for G.dmt.bis and G.lite.bis", ITU—Telecommunication Standardization Sector, Document CF–061, Clearwater, Florida, Jan. 8–12, 2001.

* cited by examiner

| | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| 1 | 1 | 0 | 0 | 0 | 0 | 1 | 0 | 0 | 0 | 1 | 0 | 0 | 1 | 0 | 0 | 0 | 0 | 0 | 0 | 0 |
| 2 | 0 | 1 | 0 | 0 | 0 | 0 | 1 | 0 | 0 | 0 | 1 | 0 | 0 | 1 | 0 | 0 | 0 | 0 | 0 | 0 |
| 3 | 0 | 0 | 1 | 0 | 0 | 0 | 0 | 1 | 0 | 0 | 0 | 1 | 0 | 0 | 1 | 0 | 0 | 0 | 0 | 0 |
| 4 | 0 | 0 | 0 | 1 | 0 | 0 | 0 | 0 | 1 | 0 | 0 | 0 | 0 | 0 | 0 | 1 | 0 | 0 | 1 | 0 |
| 5 | 0 | 0 | 0 | 0 | 1 | 0 | 0 | 0 | 0 | 1 | 0 | 0 | 0 | 0 | 0 | 0 | 0 | 0 | 0 | 1 |
| 6 | 1 | 0 | 0 | 0 | 0 | 0 | 0 | 0 | 0 | 0 | 1 | 0 | 0 | 0 | 0 | 0 | 0 | 0 | 1 | 1 |
| 7 | 0 | 1 | 0 | 0 | 0 | 0 | 0 | 0 | 0 | 0 | 0 | 1 | 1 | 0 | 0 | 0 | 1 | 0 | 0 | 0 |
| 8 | 0 | 0 | 1 | 0 | 0 | 1 | 0 | 0 | 0 | 0 | 0 | 0 | 0 | 1 | 0 | 0 | 0 | 0 | 1 | 0 |
| 9 | 0 | 0 | 0 | 1 | 0 | 0 | 1 | 0 | 0 | 0 | 0 | 0 | 1 | 0 | 1 | 0 | 0 | 0 | 0 | 0 |
| 10 | 0 | 0 | 0 | 0 | 1 | 0 | 0 | 1 | 0 | 0 | 0 | 0 | 0 | 1 | 0 | 1 | 0 | 0 | 0 | 0 |
| 11 | 1 | 0 | 0 | 0 | 0 | 0 | 0 | 0 | 1 | 0 | 0 | 0 | 0 | 0 | 1 | 0 | 1 | 0 | 0 | 0 |
| 12 | 0 | 1 | 0 | 0 | 0 | 1 | 0 | 0 | 0 | 0 | 0 | 0 | 0 | 0 | 0 | 1 | 0 | 1 | 0 | 0 |
| 13 | 0 | 0 | 1 | 0 | 0 | 0 | 1 | 0 | 0 | 1 | 0 | 0 | 0 | 0 | 0 | 0 | 1 | 0 | 0 | 0 |
| 14 | 0 | 0 | 0 | 1 | 0 | 0 | 0 | 1 | 0 | 0 | 1 | 0 | 0 | 0 | 0 | 0 | 0 | 1 | 0 | 0 |
| 15 | 0 | 0 | 0 | 0 | 1 | 0 | 0 | 0 | 1 | 0 | 0 | 1 | 0 | 0 | 0 | 0 | 0 | 1 | 0 | 0 |

Fig 4a

| | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| 1 | 1 | 0 | 0 | 0 | 0 | 0 | 0 | 0 | 0 | 1 | 0 | 0 | 0 | 0 | 0 | 1 | 0 | 0 | 1 | 0 |
| 2 | 0 | 1 | 0 | 0 | 0 | 0 | 0 | 0 | 0 | 0 | 1 | 0 | 0 | 0 | 0 | 0 | 1 | 0 | 0 | 1 |
| 3 | 0 | 0 | 1 | 0 | 0 | 1 | 0 | 0 | 0 | 0 | 0 | 0 | 0 | 0 | 0 | 0 | 0 | 1 | 0 | 1 |
| 4 | 0 | 0 | 0 | 1 | 0 | 0 | 1 | 0 | 0 | 0 | 0 | 0 | 0 | 0 | 0 | 0 | 0 | 0 | 1 | 1 |
| 5 | 0 | 0 | 0 | 0 | 1 | 0 | 0 | 1 | 0 | 0 | 0 | 1 | 0 | 0 | 0 | 0 | 0 | 0 | 1 | 0 |
| 6 | 1 | 0 | 0 | 0 | 0 | 1 | 0 | 0 | 1 | 0 | 0 | 0 | 1 | 0 | 0 | 0 | 0 | 0 | 0 | 0 |
| 7 | 0 | 1 | 0 | 0 | 0 | 0 | 1 | 0 | 0 | 1 | 0 | 0 | 0 | 1 | 0 | 0 | 0 | 0 | 0 | 0 |
| 8 | 0 | 0 | 1 | 0 | 0 | 0 | 0 | 1 | 0 | 0 | 1 | 0 | 0 | 0 | 1 | 0 | 0 | 0 | 0 | 0 |
| 9 | 0 | 0 | 0 | 1 | 0 | 0 | 0 | 0 | 1 | 0 | 0 | 1 | 0 | 0 | 0 | 1 | 0 | 0 | 0 | 0 |
| 10 | 0 | 0 | 0 | 0 | 1 | 0 | 0 | 0 | 0 | 1 | 0 | 0 | 1 | 0 | 0 | 0 | 1 | 0 | 0 | 0 |
| 11 | 1 | 0 | 0 | 0 | 0 | 0 | 0 | 0 | 0 | 0 | 1 | 0 | 0 | 1 | 0 | 0 | 0 | 1 | 0 | 0 |
| 12 | 0 | 1 | 0 | 0 | 0 | 1 | 0 | 0 | 0 | 0 | 0 | 1 | 0 | 0 | 1 | 0 | 0 | 0 | 0 | 0 |
| 13 | 0 | 0 | 1 | 0 | 0 | 0 | 1 | 0 | 0 | 0 | 0 | 0 | 1 | 0 | 0 | 1 | 0 | 0 | 0 | 0 |
| 14 | 0 | 0 | 0 | 1 | 0 | 0 | 0 | 1 | 0 | 0 | 0 | 0 | 0 | 1 | 0 | 0 | 1 | 0 | 0 | 0 |
| 15 | 0 | 0 | 0 | 0 | 1 | 0 | 0 | 0 | 1 | 0 | 0 | 0 | 0 | 0 | 1 | 0 | 0 | 1 | 0 | 0 |

MODEMS UTILIZING LOW DENSITY PARITY CHECK CODES

This application claims priority from provisional application Ser. No. 60/292,433 filed May 21, 2001, this application is also a continuation-in-part of co-owned U.S. Ser. No. 09/893,383 filed Jun. 27, 2001, now issued as U.S. Pat. No. 6,567,465, the disclosure of which is hereby incorporated by reference herein in its entirety.

BACKGROUND OF THE INVENTION

1. Field of the Invention

The present invention relates generally to telecommunications. More particularly, the present invention relates to DSL and wireless modems utilizing low density parity check (LDPC) codes and methods of simply generating such LDPC codes.

2. State of the Art

LDPC codes were invented by R. Gallager in 1963. R. G. Gallager, "Low-Density-Parity-Check Codes", MIT Press, Cambridge, Mass. 1963. Over thirty years later, a number of researchers showed that LDPC code is a constructive code which allows a system to approach the Shannon limit. See, e.g., D. J. C. MacKay and R. M. Neal, "Near Shannon limit performance of LDPC codes", Electron. Letters, Vol. 32, No. 18, August 1996; D. J. C. MacKay, "Good Error-Correcting Codes Based on Very Sparse Matrices", IEEE Transactions on Information Theory, Vol. 45, No. 2, March 1999; D. J. C. MacKay, Simon T. Wilson, and Matthew C. Davey, "Comparison of Constructions of Irregular Gallager Codes", IEEE Transactions on Communications, Vol. 47, No. 10, October 1999; Marc P. C. Fossorier, Miodrag Michaljevic, and Hideki Imai, "Reduced Complexity Iterative Decoding of LDPC Codes Based on Belief Propagation", IEEE Transactions on Communications, Vol. 47, No. 5, May 1999; E. Eleftheriou, T. Mittelholzer, and A. Dholakia, "Reduced-complexity decoding algorithm for LDPC codes", Electron. Letter, Vol. 37, January 2001. Indeed, these researchers have proved that LDPC code provides the same performance as Turbo-code and provides a range of trade-offs between performance and decoding complexity. As a result, several companies have suggested that LDPC code be used as part of the G.Lite.bis and G.dmt.bis standards. IBM Corp., "LDPC codes for G.dmt.bis and G.lit.bis", ITU—Telecommunication Standardization Sector, Document CF-060, Clearwater, Fla., 8–12 Jan. 2001; Aware, Inc., "LDPC Codes for ADSL", ITU—Telecommunication Standardization Sector, Document BI-068, Bangalore, India, 23–27, Oct. 2000; IBM Corp., "LDPC codes for DSL transmission", ITU—Telecommunication Standardization Sector, Document BI-095, Bangalore, India, 23–27, Oct. 2000; IBM Corp., "LDPC coding proposal for G.dmt.bis and G.lite.bis", ITU—Telecommunication Standardization Sector, Document CF-061, Clearwater, Fla., 8–12 Jan. 2001; IBM Corp., Globespan, "G.gen: G.dmt.bis: G.Lite.bis: Reduced-complexity decoding algorithm for LDPC codes", ITU—Telecommunication Standardization Sector, Document IC-071, Irvine, Calif., 9–13 Apr., 2001.

LDPC code is determined by its check matrix H. Matrix H is used in a transmitter (encoder) for code words generation and in a receiver (decoder) for decoding the received code block. The matrix consists of binary digits 0 and 1 and has size $M_k*M_j$, where $M_k$ is the number of columns, and $M_j$ is the number of rows. Each row in the matrix defines one of the check equations. If a "1" is located in the k'th column of the j'th row, it means that the k'th bit of the code block participates in the j'th check equation.

Matrix H is a "sparse" matrix in that it does not have many "ones". Generally, the matrix contains a fixed number of "ones" $N_j$ in each column and a fixed number of "ones" $N_k$ in each row. In this case, design parameters should preferably satisfy the equation:

$$M_k*N_j=M_j*N_k \tag{1}$$

Although it is convenient to have equal numbers of "ones" in each column and in each row, this is not an absolute requirement. Some variations of design parameters $N_k$ and $N_j$ are permissible; i.e., $N_k$ (j) and $N_j$ (k) can be functions of j and k, correspondingly. In addition, another important constraint for matrix design is that the matrix should not contain any rectangles with "ones" in the vertices. This property is sometimes called "elimination of cycles with length 4" or "4-cycle elimination". For purposes herein, it will also be called "rectangle elimination".

Generally, there are two approaches in the prior art to designing H matrices. The first approach was that proposed by Gallager in his previously cited seminal work, R. G. Gallager, "Low-Density-Parity-Check Codes", MIT Press, Cambridge, Mass. 1963, and consists of a random distribution of $N_j$ ones within each matrix column. This random distribution is carried out column by column, and each step is accompanied by rectangle elimination within the current column relative to the previous columns. The second approach to H-matrix design is based on a deterministic procedure. For example, in the previously cited IBM Corp., "LDPC codes for G.dmt.bis and G.lit.bis", ITU—Telecommunication Standardization Sector, Document CF-060, Clearwater, Fla., 8–12 Jan. 2001, a deterministic H-matrix construction is proposed which includes identity matrices and powers of an initial square permutation matrix.

Both of the prior art approaches to designing H matrices have undesirable characteristics with respect to their implementation in DSL and wireless standards. In particular, the random distribution approach of Gallager is not reproducible (as it is random), and thus, the H matrix used by the transmitting modem must be conveyed to the receiving modem. Because the H matrix is typically a very large matrix, the transfer of this information is undesirable. On the other hand, while the deterministic matrix of IBM is reproducible, it is extremely complex and difficult to generate. Thus, considerable processing power must be dedicated to generating such a matrix, thereby adding complexity and cost to the modem. Besides, this approach does not allow constructing a matrix with arbitrary design parameters $M_k$ and $M_j$.

SUMMARY OF THE INVENTION

It is therefore an object of the invention to provide simple methods of generating reproducible H matrices.

It is another object of the invention to provide modems which utilize simply generated reproducible H matrices.

In accord with these objects which will be discussed in detail below, the modem of the invention generally includes a receiver and a transmitter with the transmitter including a substantially deterministic LDPC encoder. The encoder is a function of a substantially deterministic H matrix (H=A|B) which is determined according to the steps and rules set forth below. More particularly, in one embodiment, the encoder takes a block of bits and utilizes a generation matrix $G=A^{-1}B$ which is derived from (i.e., is a function of) the H matrix in order to generate redundant parity bits. The redundant bits are appended to the original block of bits to generate a word.

According to a first embodiment of the invention, the substantially deterministic H matrix is determined as follows. First, the "ones" of a first column $N_j$ are assigned randomly or deterministically. Preferably, the ones are distributed evenly within the first column with the first "1" in the first row of the first column according to the algorithm:

$$H(r, 1)=1, \text{ where } r=1+(i-1)*\text{integer } (M_j/N_j);\ i=1,2, \ldots N_j \quad (2)$$

Then, beginning with the second column, assignment of "ones" is carried out deterministically with each "1" in a previous (ancestor) column generating a "1" in the next (descendant) column based on the rule that a descendant is placed one position below or one position above an ancestor (it being determined in advance by convention whether the position below is used or the position above is used). As a result, a descending diagonal or an ascending diagonal is generated. Where a descending diagonal is used and the ancestor is in the lowest row of the matrix, the descendant may take any position in the next column, although it is preferable to place the descendant in the highest free position.

When distributing "ones" in any given column, each new descendant should be checked to ensure that no rectangles are generated in conjunction with other "ones" in the current column and previous columns. If a rectangle is generated, the location of the descendant is changed, preferably by shifting the location down or up (by convention) one position at a time until the descendant is in a position where no rectangle is generated. If the position is shifted down and the lowest position is reached without finding a suitable position, the search is continued by shifting the location one position up from the initial descendant position until a suitable position is found.

According to the first embodiment of the invention, the descendants may be generated in any given order. Two preferable generation orders correspond to increasing or decreasing ancestor positions in the column. For example, descendants may be generated by first generating a descendant for the ancestor at the bottom of the matrix, then by generating a descendant for the ancestor above that in the column, then by generating a descendant for the ancestor above that one, etc. (also called herein "bottom-up"); or by first generating a descendent for the ancestor at the top of the matrix, then by generating a descendant for the ancestor below that in the column, then by generating a descendant for the ancestor below that one, etc. (also called herein "top-down").

When generating descendants it is possible that one or more descendants can "disappear" because of the lack of free positions satisfying the rectangle elimination criterium. To regenerate the "lost descendant", it is generally sufficient to change the order of descendant generation for that column. Thus, if the order of descendant generation was conducted "bottom-up", the direction of generation is switched to "top-down" and vice versa; preferably for that column only. If changing the order of descendant generation in a column does not cause a free position to appear, the descendant disappears for that column.

When a descendant disappears it is desirable in the next column to provide a new descendant which does not have an ancestor. In this case, a search of an acceptable position for an "ancestor-less" descendant is conducted, preferably from the first row down.

According to a second embodiment of the invention, a deterministic H matrix is provided where ones are placed into the matrix in a completely diagonal manner. The diagonals are preferably subdivided into groups or sets of an equal number of diagonals. The number of diagonals in each group is set equal to $N_j$ (the required number of ones in a column), and the number of diagonal sets N in the matrix is determined according to $N=\text{ceil}(M_k/M_j)$, where "ceil" is an indication of rounding-up to the next whole number. The first or left-most diagonal in each set begins from a point with coordinates H(1, k), where $k=(1+(i*M_j))$ and where i is an index of the set number ($i=0,1,2, \ldots N-1$). The remaining diagonals in the set are shifted relative to the first diagonals so that the column distance (i.e., the absolute value of the difference between the column number of a first point in a row and the column number of another point in the same row) between any two pairs of diagonals is unique; i.e., there are no two pairs of diagonals which are separated by the same distance.

A preferred manner of implementing the second embodiment of the invention is to locate the first point of the first diagonal of each set according to H(1, k), where $k=(1+(i*M_j))$, $i=0,1,2, \ldots N-1$. The first point of the second diagonal of each set is then located by shifting the first point of the second diagonal by a different predetermined number of columns over from the first point of the first diagonal of that set (depending on the number of diagonals in a set). Where third diagonals are provided in each set, the first point of each third diagonal is then located by shifting the first point of the third diagonal a different predetermined number of columns over from the first point of the second or first diagonals. Additional diagonals for each set, if any, are likewise located.

According to the second embodiment of the invention, since the H-matrix may be determined easily and deterministically, various options exist for transmitting H-matrix information from the transmitter of one modem to the receiver of another modem or vice versa. In a preferred arrangement, since most modems will typically make use of only a few LDPC codes, the sequence (or the algorithm which generates the sequence) for each likely LDPC code may be stored, e.g., at the receiver, and then the transmitting modem can simply transfer an indication of the code being used. The receiving modem can then generate the H-matrix accordingly. In a second arrangement, both the matrix size and the diagonal column-displacement sequences can be transmitted. In a third arrangement, both the matrix size and the algorithm by which the diagonal column-displacement sequence is generated are transmitted.

Additional objects and advantages of the invention will become apparent to those skilled in the art upon reference to the detailed description taken in conjunction with the provided figures.

BRIEF DESCRIPTION OF THE DRAWINGS

FIG. 4*a* is an H matrix of size 20×15 generated using bottom-up descendant generation.

FIG. 4*b* is an H matrix of size 20×15 generated using top-down descendant generation.

DETAILED DESCRIPTION OF THE PREFERRED EMBODIMENTS

Figure 1:
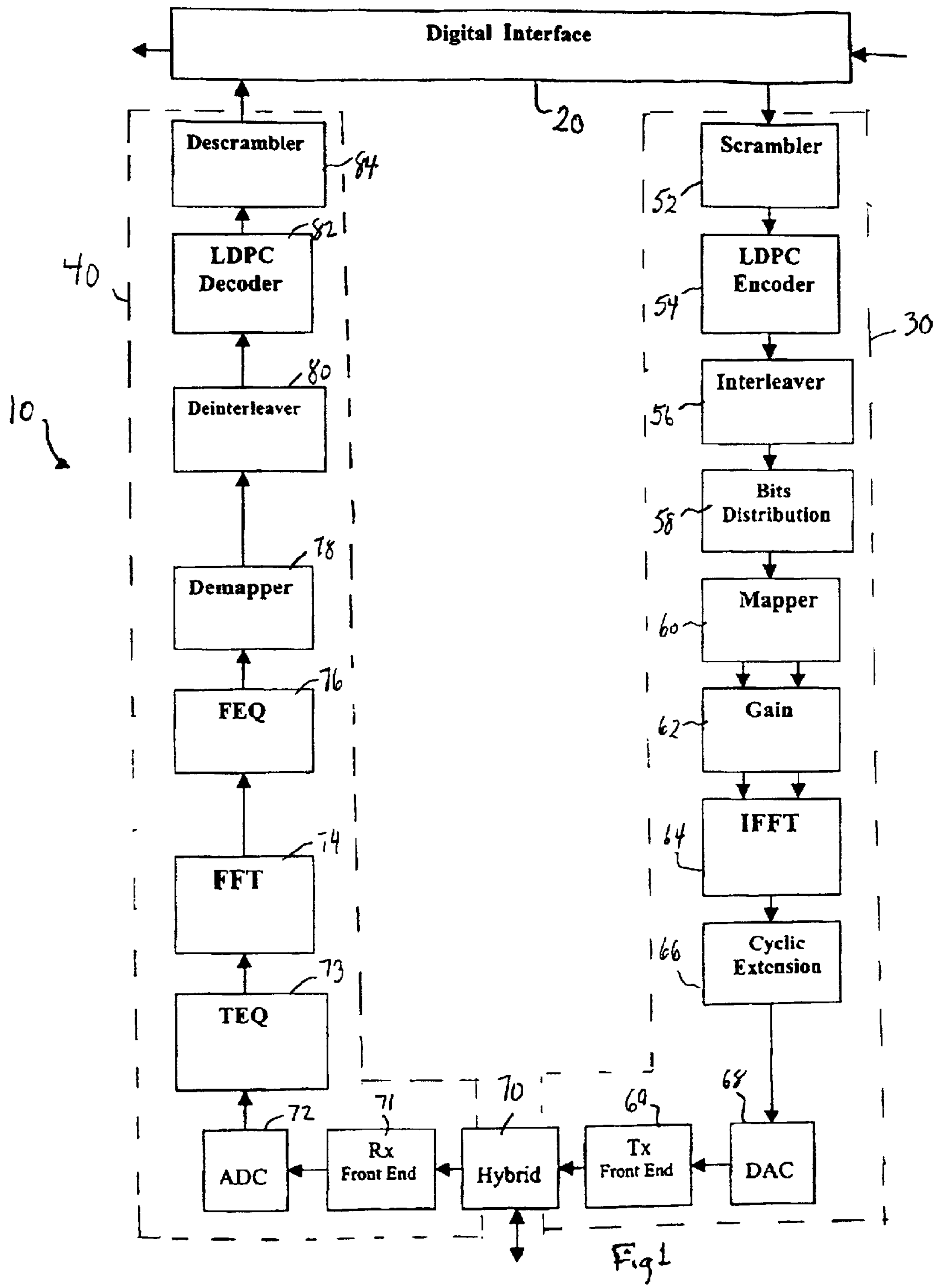
FIG. 1 is a high level block diagram of a DSL modem utilizing LDPC encoding and decoding according to the invention.

Turning to FIG. 1, a high level block diagram of a DSL modem 10 is seen. The modem 10 preferably includes a digital interface 20, a transmitter section 30 and a receiver section 40. The transmitter section preferably includes a scrambler 52 which receives data from the digital interface 20, a LDPC encoder 54, an interleaver 56, a bit distributor 58, a mapper 60, a gain element 62, an inverse fast Fourier transform block (IFFT) 64, a cyclic extension block 66, a digital to analog converter 68 and a front end transmit block 69 which interfaces with a hybrid 70. The receiver section preferably includes an analog front end 71 which interfaces with the hybrid 70, an analog to digital converter 72, a time domain equalizer (TEQ) 73, a fast Fourier transform block (FFT) 74, a frequency equalizer (FEQ) 76, a demapper 78, a deinterleaver 80, a LDPC decoder 82, and a descrambler 84 which provides data to the digital interface 20. Other than the details of the LDPC encoder 54 (and decoder 82), the modem 10 is substantially as would be understood by those skilled in the art. In addition, it will be appreciated by those skilled in the art that the modem 10 may be implemented in hardware, software, or a combination thereof.

Figure 2:
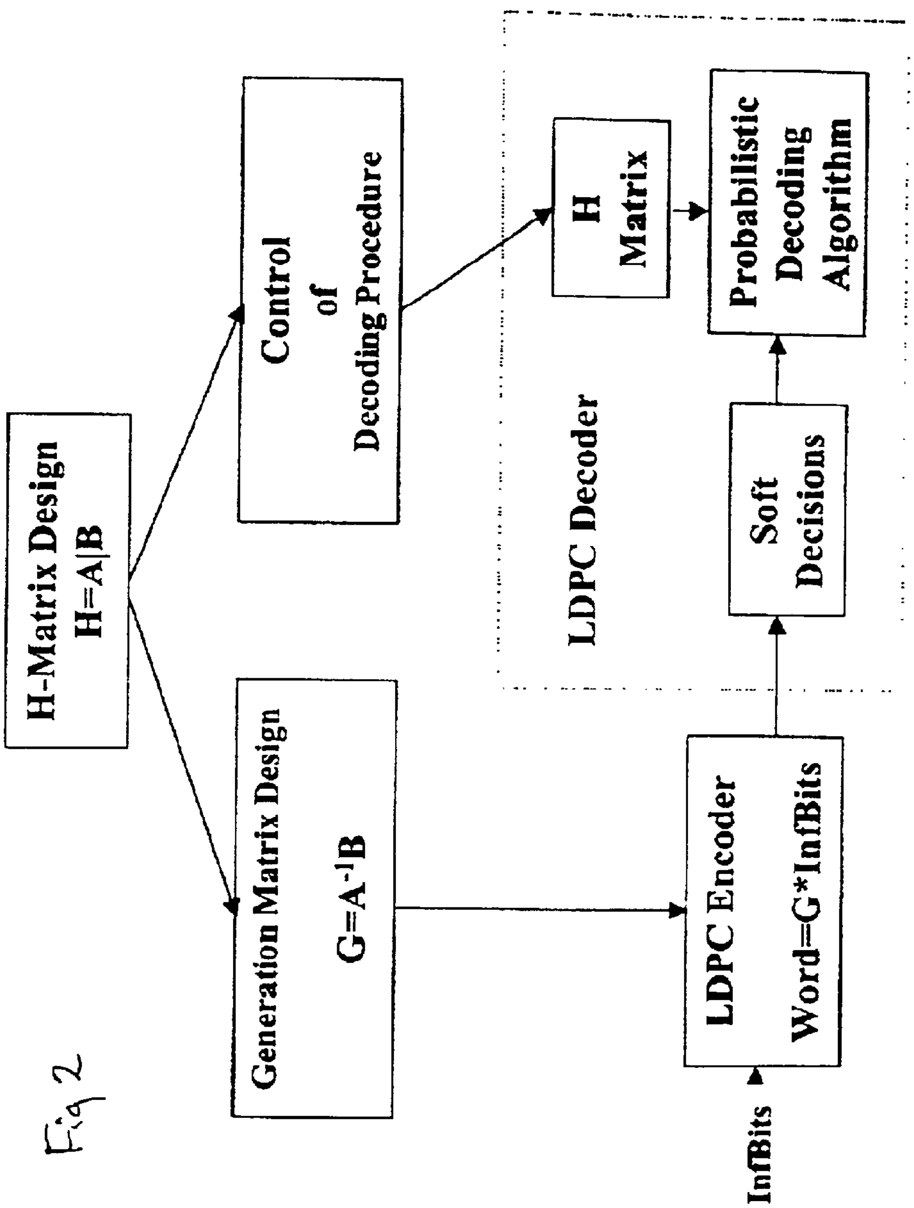
FIG. 2 is a high level flow diagram of a manner of using an H matrix in the DSL modem of FIG. 1.

High level details of the LDPC coder 54 and decoder 82 are seen in FIG. 2. In particular, the LDPC coder 54 and decoder 82 utilize an H matrix which is designed according to the steps and rules set forth below. The H matrix, where H=A|B, with A being a square matrix and B being the remaining matrix rectangle, is used for encoding purposes to generate a generation matrix G. Matrix G is defined by $G=A^{-1}B$, which results from multiplying the inverse of the square A matrix with the rectangular B matrix. The LDPC encoder 54 uses the G matrix and a block of bits received from the scrambler 52 to generate a set of parity bits (also called redundant bits). The parity bits are appended to the block of bits received from the scrambler 52 to generate a word which is forwarded to the interleaver 54 and further processed. If desired, and as suggested by FIG. 2, rather than appending the redundant bits to the block of data, the G matrix may include an "identity matrix" portion so that a multiplication of the G matrix and the block of bits directly provides the resulting word.

The H matrix is likewise used on the decoding side. In particular, deinterleaved words received by the LDPC decoder are subjected to soft decisions (as is known in the art), and then subjected to probabilistic decoding which requires information of the H matrix which was utilized to generate the parity bits.

The H matrix (and G matrix) may be generated by a microprocessor (not shown) and software which may also be used to implement one or more additional elements of the transmitter or receiver of the modem 10. Alternatively, the H matrix (and G matrix) may be implemented in other hardware and/or software in the modem 10. Technically, only the G matrix needs to be available for the transmitter (encoding), while only the H matrix is needed for the receiver (decoding).

Figure 3:
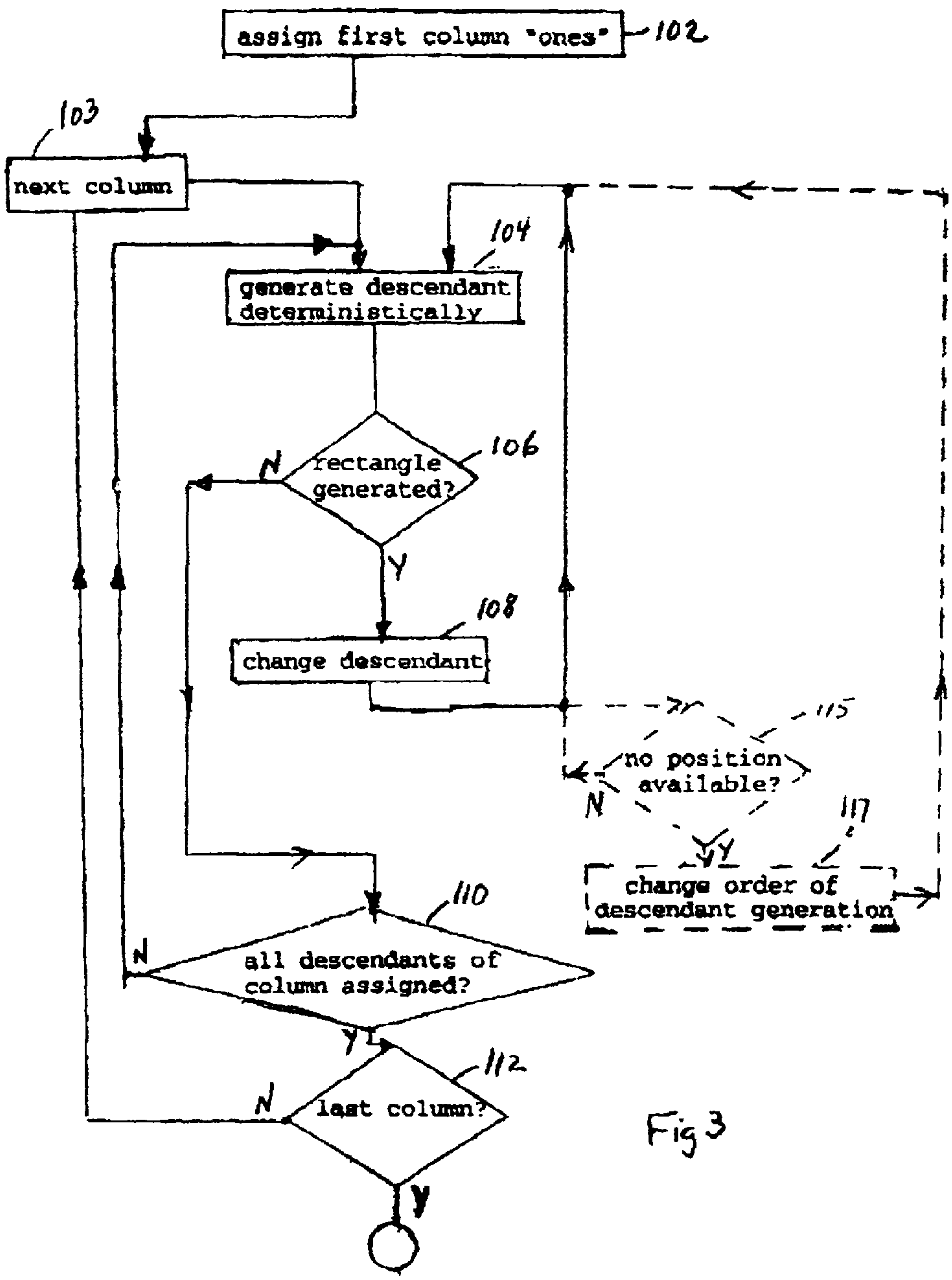
FIG. 3 is a flow chart of a method of generating an H matrix according to a first embodiment of the invention.

According to the invention, the H matrix is a substantially deterministic matrix which, according to a first embodiment, may be determined according to the steps of FIG. 3. First, at step 102 the "ones" of a first column $N_j$ are assigned randomly or deterministically. Preferably, the "ones" are distributed evenly within the first column with the first "1" in the first row of the first column according to relationship (2) set forth above:

$$H(r,1)=1, \text{ where } r=1+(i-1)*\text{integer } (M_j/N_j);\ i=1,2, \ldots N_j$$

where $M_j$ is the number of rows in the matrix and $N_j$ is the number of "ones" in the column. Thus, if the "ones" are assigned deterministically, the first "one" is located at H(1,1) and the remainder of "ones" for the column are evenly distributed in the column. If, on the other hand, the "ones" are assigned randomly, preferably, a "one" is located in a random row of column 1, and the remaining "ones" are evenly distributed. While less preferred, all "ones" in column one can be randomly located.

Returning to FIG. 3, once the "ones" of the first column are assigned, at 103 the next column is addressed. In particular, at 104, each of the "ones" of the next column is generated deterministically (i.e., according to a predetermined set of rules). In particular, a "one" of the second column (called a "descendant") is generated at 104 by placing the descendant "1" one position below or one position above its "ancestor" "one" of the previous column (it being determined in advance by convention whether the position below is used or the position above is used). As a result, a descending diagonal or an ascending diagonal is generated. Where a descending diagonal is used and the ancestor is in the lowest row of the matrix, the descendant may take any position in the next column, although it is preferable to place the descendant in the highest free position. This may be seen with reference to columns 5 and 6 of FIG. 4*b*. As seen in FIG. 4*b*, H(15,5)=1, and accordingly, the descendant is found in the first row of column 6; i.e., H(1,6)=1. Similarly H(15,9) generates H(1,10), and H(15,12) generates H(1,13). Conversely, where an ascending diagonal is used and the ancestor is in the highest row of the matrix, the descendant may take may position in the next column, although it is preferable to place the descendant in the lowest free position.

When distributing "ones" in any given column, at 106, each new descendant is checked to ensure that no rectangles are generated in conjunction with other "ones" in the current column and previous columns. If a rectangle is generated, a command to change the location of the descendant is issued at 108, preferably by shifting the location down or up (by convention) one position at a time (at 104) until the descendant is in a position where no rectangle is generated (as determined at 106). If the position is shifted down and the lowest position is reached without finding a suitable position, the search is continued by shifting the location one position up from the initial descendant position until a suitable position is found.

Rectangle elimination is seen in the matrix of FIG. 4*a*. In particular, referring to the fifth and sixth columns, according to the rule of descendants, ancestor H(5,5)=1 should generate a descendant H(6,6)=1. However, this descendant would cause a rectangle to appear in conjunction with H(1,6), H(1,1), and H(6,1). Going down in column 6, it is seen that position H(7,6) is also not acceptable as it would cause a rectangle to appear in conjunction with H(7,2), H(12,2) and H(12,6). Thus, the descendant of H(5,5) is found in position H(8,6).

According to the invention, the descendants may be generated in any given order. Two preferable generation orders correspond to increasing or decreasing ancestor positions in the column. For example, descendants may be generated by first generating a descendant for the ancestor at the bottom of the matrix, then by generating a descendant for the ancestor above that in the column, then by generating a descendant for the ancestor above that one, etc. (also called herein "bottom-up"). The bottom-up technique is seen in FIG. 4*a*, where a descendant is generated first for H(15,5), then for ancestor H(10,5), and finally for ancestor H(5,5). Alternatively, descendants may generated by first generating a descendent for the ancestor at the top of the matrix, then by generating a descendant for the ancestor below that in the column, then by generating a descendant for the ancestor below that one, etc. (also called herein "top-down"). The top-down technique generates a full diagonal of "ones" from H(1,1) to $H(M_j,M_j)$ as is seen in FIG. 4*b*. In FIG. 4*b*, a descendant is generated first for H(5,5), then for ancestor H(10,5), and finally for ancestor H(15,5). Regardless of whether the top-down or bottom-up technique is used, at 110, a determination is made as to whether all descendants for a column have assigned. If all descendants for the column have not been assigned, the program cycles through steps 104–110. If all descendants for the column have been assigned, unless a determination is made at 112 that the column is the last column, the next column is accessed at 103 for placement of descendant "ones".

When generating descendants it is possible that one or more descendants can "disappear" because of the lack of free positions satisfying the rectangle elimination criterium. This determination can be made at step 115 (shown in phantom after step 108). To regenerate the "lost descendant", it is generally sufficient to change the order of descendant generation for that column (step 117—shown in phantom). Thus, if the order of descendant generation was conducted "bottom-up", the direction of generation is switched to "top-down" and vice versa. Preferably, the order of descendant generation is changed only for that column. If changing the order of descendant generation in a column does not cause a free position to appear, the descendant disappears for that column.

When one or more descendants disappear in a column, it is desirable in the next column to provide a new descendant for each descendant which does not have an ancestor. In this case, a search of acceptable positions for each "ancestor-less" descendant is conducted, preferably from the first row down.

Generally, as set forth above, the number of "ones" in each column $N_j$ is determined by the number of "ones" in the previous column, because a descendant is generated for each ancestor. In the preferred embodiment of the invention, this number is fixed and defined as a design parameter. On the other hand, the number of "ones" in each row (row weight) is preferably limited to a maximum row weight ($Max(N_k)$) which is also a design parameter. Thus, if during distribution of "ones" within a particular column, the number of "ones" in some row reaches $Max(N_k)$, "ones" should not be inserted in that row (i.e., the remaining part of the row is automatically filled with "zeros"), and the descendant "one" is moved by shifting the location of the descendant one position down or up (by convention).

An implementation in Matlab of the method of H matrix design according to FIG. 3 as described above is as follows:

```
Check-Matrix initialization
Mk=input('number of matrix columns, code block length          Mk=   ');
Nj=input('number of "ones" in a column, number of checks for bit   Nj=   ');
Nk=input('number of "ones" in a row, number of bits in each check   Nk=   ');
Mj=input('number of matrix rows, number of check equations        Mj=   ');
C=[];                              %Check-Matrix
w=[0 2*(ones(size(1:(Mk−1))))];
for j=1:Mj
      C=[C;w];
end
vNk=zeros(size(1:Mj));             %current numbers of "ones" in rows
vNj=zeros(size(1:Mk));             %current numbers of "ones" in columns
1-st column initialization
rr=floor(Mj/Nj);
for jr=1:Nj                        %evenly distributed ones
      r=1+(jr−1)*rr;
      C(r,1)=1;
      vNk(r)=1;
end
VNj(1)=Nj;
Matrix Design
for k=1:(Mk−1)                     %column by column "1" assignment
z=C(:, (k+1));
for h=1:2                          %h=1:search, beginning from the last row
if h==1
count=0;counth1=0;                 %current number of "ones" in the column
for jj=1:Mj                        %row by row assignment, beginning from Mj
x=0;
j=Mj+1−jj;
if j==Mj & C(Mj,k)==1              %transfer "1" from last row to 1-st row
n=0;nn=0;
while nn==0 & n<Mj
n=n+1;
```

-continued

```
if C(n, (k+1))==2
C(n, (k+1))=1;
nn=1;counth1=counth1+1;
end
end
x=n;
elseif C(j,k)==1 & C((j+1),(k+1))==2        %typical diagonal shift
C((j+1),(k+1))=1;
x=j+1;
counth1=counth1+1;
elseif C(j,k)==1 & C((j+1),(k+1))<2         %additional shift
m=0;nn=0;
while nn==0 & m<(Mj−1)                      %searching the acceptable place
m=m+1;
if (j+1+m)<(Mj+1)                           %searching down
nm=m;
elseif (j+1+m)>Mj                           %searching up
nm=Mj−j−1−m;
end
if C(j+1+nm, (k+1))==2
C(j+1+nm, (k+1))=1;
nn=1;counth1=counth1+1;
end
end
x=j+1+nm;
end
if x>0                          %rectangle elimination
count=count+1;
kk=k;
while kk>0
if C(x,kk)==1
for jj=1:Mj
if (C(jj,kk)==1) & (abs(jj−x)>0) & (count<Nj)
C(jj, (k+1))=0;
end
end
end
kk=kk−1;
end
end
end                             %for jj=1:Mj(end of one column design for h=1)
elseif h==2 & counth1<Nj
count=0;counth2=0;
for jj=1:Mj                     %row by row "1" assignment from 1-st row
x=0;
j=jj;
if j==Mj & C(Mj,k)==1           %transfer "1" from last row to 1-st row
n=0;nn=0;
while nn==0 & n<Mj
n=n+1;
if z(n)==2
z(n)=1;
nn=1;
counth2=counth2+1;
end
end
x=n;
elseif C(j,k)==1 & z(j+1)==2
z(j+1)=1;
x=j+1;
counth2=counth2+1;
elseif C(j,k)==1 & z(j+1)<2
m=0;nn=0;
while nn==0 & m<(Mj−1)          %searching the acceptable place
m=m+1;
if (j+1+m)<(Mj+1)               %searching down
nm=m;
elseif (j+1+m)>Mj               %searching up
nm=Mj−j−1−m;
end
if z(j+1+nm)==2
z(j+1+nm)=1;
nn=1;
counth2=counth2+1;
end
end
X=j+1+nm;
end
if x>0                          %rectangle elimination
```

-continued

```
count=count+1;
kk=k;
while kk>0
if C(x,kk)==1
for jj=1:Mj
if (C(jj,kk)==) & (abs(jj−x)>0) & (count<Nj)
z(jj)=0;
end
end
end
kk=kk−1;
end
end
end                            %for jj=1:Mj(end of one column design for h=2)
if counth2 >counth1
C(:, (k+1))=z;
end
end                            %if h==1
end                            %for h=1:2
if vNj(k)<Nj                   %ancestor recreation
qq=0;f=0;
while f<1 & qq<Mj
qq=qq+1
if C(qq, (k+1))==2
C(qq, (k+1))=1;
f=f+1
end
end
end
for jj=1:Mj
if C(jj, (k+1))==1
vNk(jj)=vNk(jj)+1;             %calculation of ones in each row
vNj(k+1)=VNj(k+1)+1;           %calculation of ones in each column
else
C(jj, (k+1))=0;                %change "2" to "0" in columns
end
if vNk(jj)==Nk
for kk=(k+2):Mk                %change "2" to "0' in rows
C(jj,kk)=0;
end
end
end
end                            %for k=1:(Mk−1)(end of columns design)
C;                             %demo:Check Matrix
vNj                            %demo:Number of ones in columns
vNk                            %demo:Number of ones in rows
```

It will be appreciated by those skilled in the art that other implementations of generating an H matrix design in Matlab or in other software or hardware are easily obtained.

Figure 5:
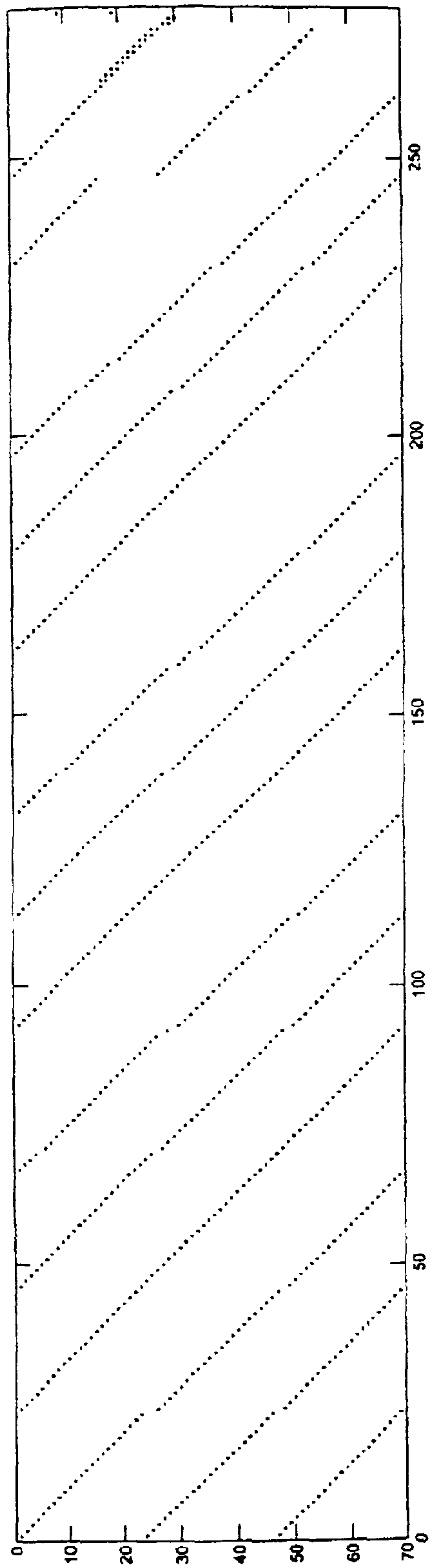
FIG. 5 is an H matrix of size 276×69 generated using bottom-up descendant generation.
Figure 6:
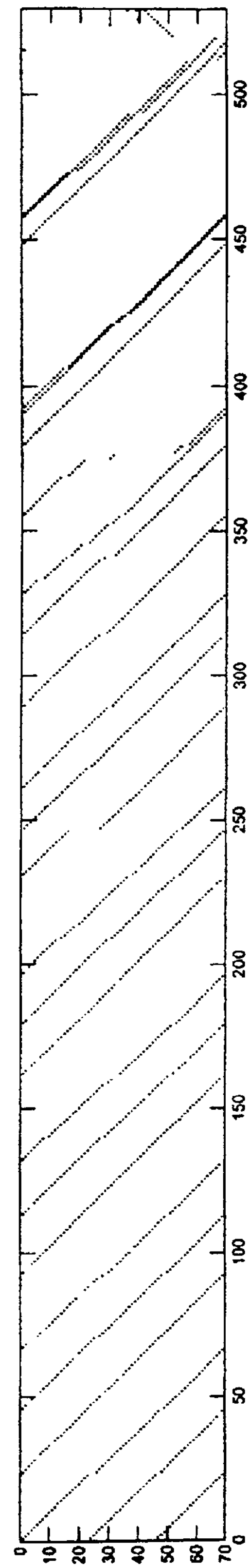
FIG. 6 is an H matrix of size 529×69 generated using bottom-up descendant generation.

FIG. 5 is an H matrix of size 276×69 generated using bottom-up descendant generation as set forth in the previously listed Matlab program. The H matrix of FIG. 5 has design parameters $M_k$=276, $M_j$=69, $N_k$=12, $N_j$=3. The generated H matrix contains a fixed number of "ones" in columns $N_j$=3, and a fixed number of "ones" in rows $N_k$=12. Similarly, FIG. 6 is an H matrix of size 529×69 generated using the previously listed Matlab program. The H matrix of FIG. 6 has the design parameters $M_k$=529, $M_j$=69, Max ($N_k$)=12, $N_j$=3. This H matrix contains a fixed number of "ones" in its columns, $N_j$=3; and a nonfixed, but limited number of "ones" in its rows, $20<N_k<25$. In FIGS. 5 and 6, a "one" is shown by a dot, while a "zero" is shown by the absence of a dot.

Figure 7A:
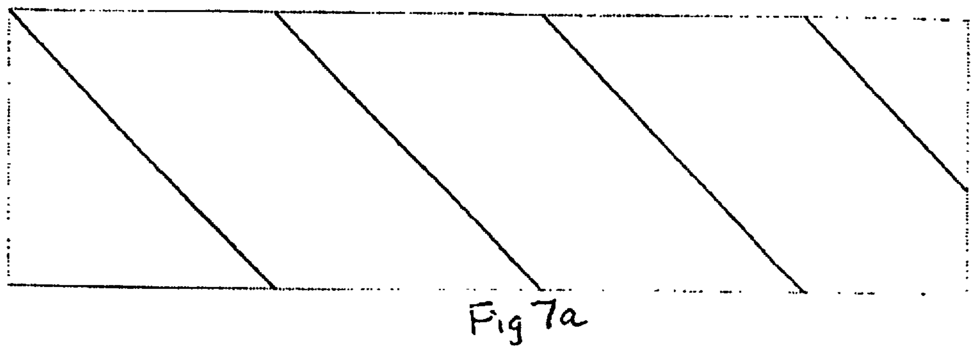
FIGS. 7*a*–7*c* are examples of initialization values for the H matrix.
Figure 7B:
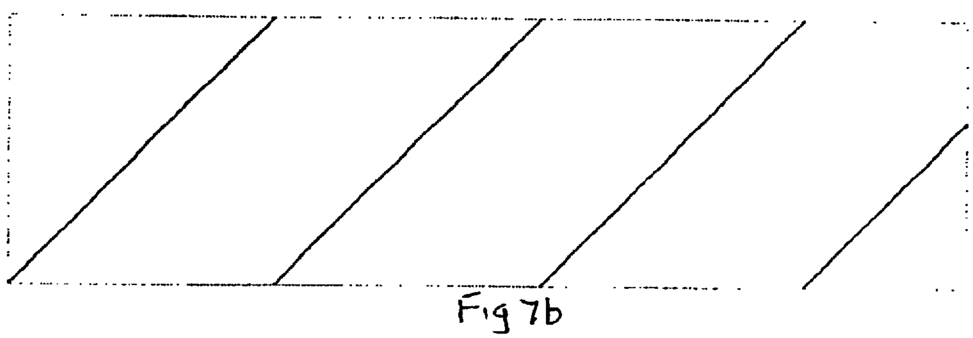
Figure 7C:
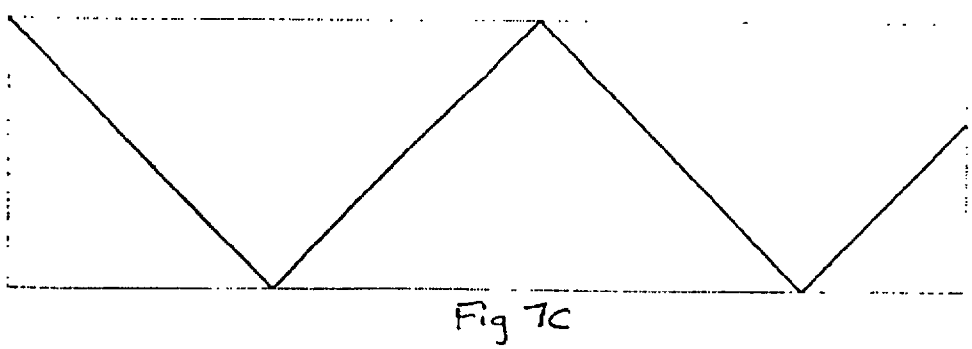
Figure 8:
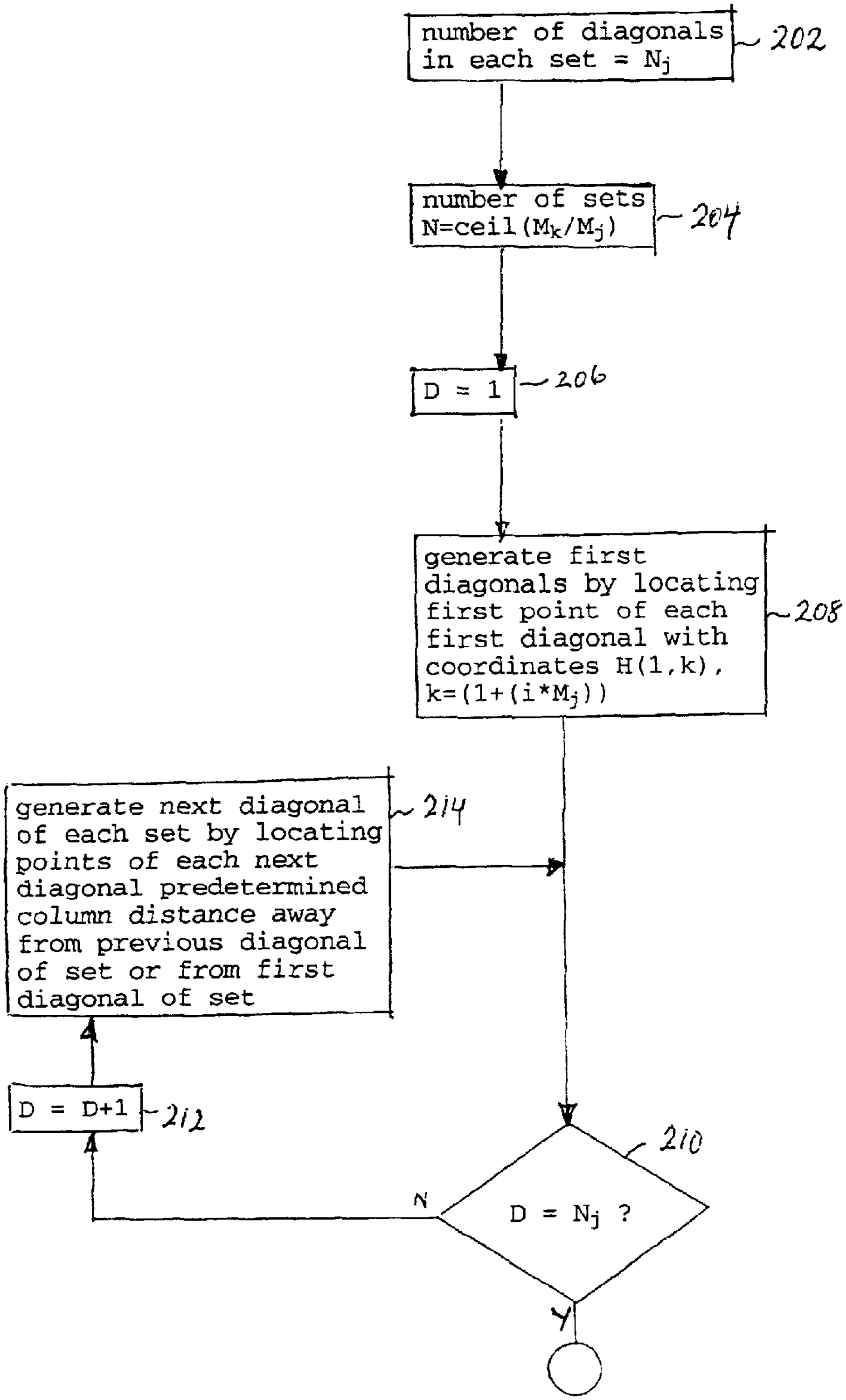
FIG. 8 is a flow chart of a method of generating an H matrix according to a second embodiment of the invention.

According to an aspect of the first embodiment of the invention, the design procedure for generating the H matrix may be simplified. In particular, because every column should contain at least one "1", it is possible to initialize the H matrix with an effectively continuous diagonal. Three such diagonals are shown in FIGS. 7a–7c, with FIG. 7a representing a descending diagonal, FIG. 7b representing an ascending diagonal, and FIG. 7c representing a mixed descending-ascending diagonal. Of course, an ascending-descending diagonal (not shown) could likewise be utilized. With the H matrix initialized as shown, the steps shown in FIG. 3 are carried out only with respect to the "ones" which are distributed in the first column and their descendants, thereby reducing the number of calculations required.

With the substantially deterministic method of generating H matrices set forth above, it will be appreciated that if standard conventions (e.g., deterministic first column, descending diagonal generation, bottom-up descendant generation) are agreed upon for all modems, the only information which must be transferred from a transmitting modem to a receiving modem regarding the H matrix includes the matrix size ($M_k$×$M_j$), and the number (or maximum thereof) of "ones" in a row or column; $N_k$ and $N_j$. If standard conventions are not used, code representing one or more of: whether descending or ascending diagonals are used, whether bottom-up or top-down descendant generation is used, the basis of the first column, etc. will also be required to be sent from the transmitting modem to the receiving modem. Regardless, the generation of the H matrix (and hence the G matrix) will be greatly simplified in both the transmitter and receiver.

Turning now to FIGS. 8–13, a second and presently preferred embodiment of the invention is seen, where a deterministic H matrix is provided and has ones placed into the matrix in a completely diagonal manner. According to the second embodiment of the invention, the diagonals are preferably subdivided into groups or sets of an equal number of diagonals. Thus, at 202 of FIG. 8, the number of diagonals in each group is set equal to $N_j$ (the required number of ones in a column), and at 204, the number of diagonal sets N in the matrix is determined according to N=ceil($M_k/M_j$), where "ceil" is an indication of rounding-up to the next whole number. Then, at 206, a tracking variable D is set to one, and at 208 the first diagonal from each set is generated by providing the first point of each diagonal with coordinates H(1, k), where k=(1+(i*$M_j$)) and where i is the set number (i=0,1,2, . . . N−1). Once the first point of a diagonal is set, the diagonal is easily generated by placing a next point one column over and one row down from the first point, a next point one column over and one row down from that point, etc.

At 210, a determination is made as to whether D equals $N_j$, and if so, the H matrix is considered complete. If D does not equal $N_j$, at 212, D is incremented by one, and at 214 the second diagonal (D=2) of each set is generated by locating the points of the second diagonals at predetermined column-distances away from the points of the first diagonals. According to the invention, the method returns to step 210, and cycles through steps 210, 212, and 214, thereby generating additional sets of diagonals which are located yet different distances from the first diagonal of each set until D equals $N_j$ and the H matrix is completed.

It should be noted that in generating the second and additional diagonals of each set, the column distances between diagonals is chosen so that the column distance between any two pairs of diagonals is unique; i.e., there are no two pairs of diagonals which are separated by the same column distance. This rule guarantees that no rectangles are generated.

It has been found that there exist several solutions to generating the additional diagonals of each set so that no two pairs of diagonals are separated by the same column distance. For example, where $N_j$=2, the points of the second diagonals may be shifted by 1+i columns relative to the points of the first diagonals so that in the first set, the diagonals are adjacent (i.e., column distance=1), in the second set, the column distance between the first and second diagonals=2, in the third set, the column distance between the first and second diagonals=3, etc. Alternatively, for $N_j$=2, the points of the second diagonal of the first set may be chosen so that the column difference=1, in the second set the column difference=2; in the third set the column difference=5; in the fourth set the column difference=9; in the fifth set the column difference=6; in the seventh set the column difference=17 etc. This solution is obtained according to the following Matlab code which finds appropriate solutions for different $N_j$ values and different matrix sizes.

```
%Finding sequence of shift numbers for diagonal H-matrix structure
%Based on the sufficient condition of rectangle elimination
Mk=input('number of matrix columns,code block length    Mk=    ');
Mj=input('number of matrix rows,code checks             Mj=    ');
Nj=input('number of ones in a column                    Nj=    ');
N=ceil (Mk/Mj);
Initial=[];difference=[];
for i=1:N
    Initial(i)=1+(i−1)*Mj;
end
for j=1:N
    difference(j)=abs(Initial(1)−Initial(j));
end
Decision=Initial;
```

-continued

```
s=size(Decision);M0=s(2);
sd=size(difference);Md=sd(2);
M=M0;
for sect=1:N
for j=1:(Nj−1)
    stop=0; cand=0;
    while stop<1
        stop=1;
        cand=cand+1;
        candidate=Decision(sect)+cand;
        for i=1:M
            d(i)=abs(candidate-Decision(i));
        end
        for kr=1:M
            for rk=1:M
                dkr=abs(kr−rk);
                if dkr>0
                    ddkr=abs(d(kr)−d(rk));
                    if ddkr==0
                        stop=0;
                    end
                end
            end
        end
        for n=1:Md
            for k=1:M
                dd=abs(difference(n)−d(k));
                if dd==0
                    stop=0;
                end
            end
        end
    end
    dif=[];
    for m=1:M
        dif(m)=abs(candidate − Decision(m));
    end
    difference=[difference dif];sd=size(difference);        Md=sd(2);
    Decision=[Decision candidate];M=M+1;
end
end
shift=[];
for j=1:N
    for i=1:(Nj−1)
        shift(j,i)=Decision(M0+(j−1)*(Nj−1)+i)−Decision(j);
    end
end
shift
```

Figure 9:
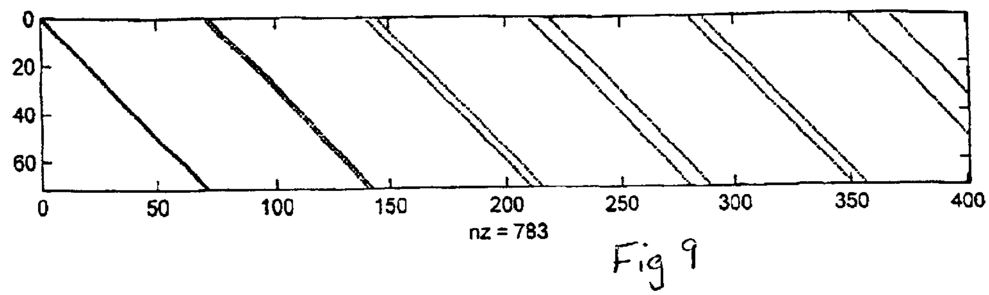
FIG. 9 is an H matrix of size 400×70 using six sets of two diagonals according to the method of the second embodiment of the invention.
Figure 10:
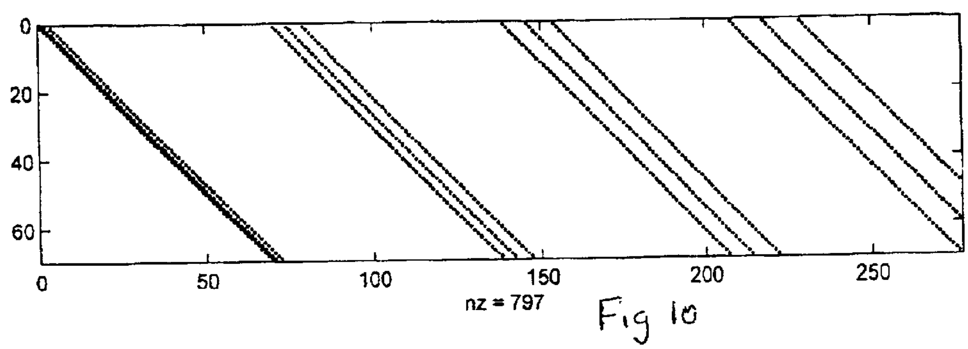
FIG. 10 is an H matrix of size 276×69 using four sets of three diagonals according to the method of the second embodiment of the invention.

The H matrix FIG. 9 (size 400×70) was generated by using six sets of two diagonals according to the method of the second embodiment of the invention and utilizing the Matlab program set forth above. Thus, it is seen, that the sequence of column distances between the first and second diagonals of the six sets of diagonals is 1, 2, 5, 9, 6, and 17.

When $N_j$=3, according to a preferred aspect of the invention, the points of the second diagonals are preferably shifted by 1+(3*i) columns relative to the points of the first diagonals, and the points of the third diagonals are generated by shifting 2+(3*i) columns relative to the points of the second diagonals. Thus, in FIG. 10, an H matrix (size 276×69) is seen using four sets of three diagonals according to the method of the second embodiment of the invention. The column distances between the first and second diagonals of the four sets are 1, 4, 7, and 10 respectively, while the column distances between the second and third diagonals are 2, 5, 8, and 11 respectively.

Figure 11:
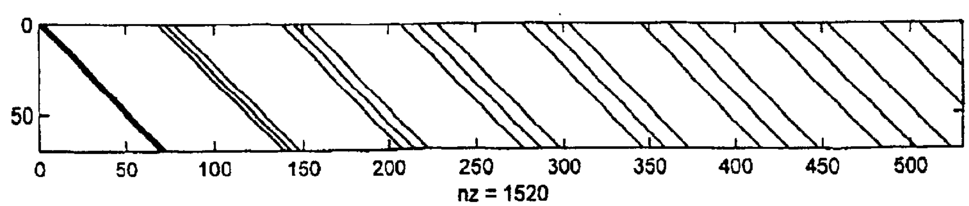
FIG. 11 is an H matrix of size 529×69 using eight sets of three diagonals according to the method of the second embodiment of the invention.

Similarly, with $N_j$=3, an H matrix (size 529×69) using eight sets of three diagonals according to the method of the second embodiment of the invention is seen in FIG. 11. In FIG. 11, the last diagonal of the last set contains only a couple of points.

Figure 12:
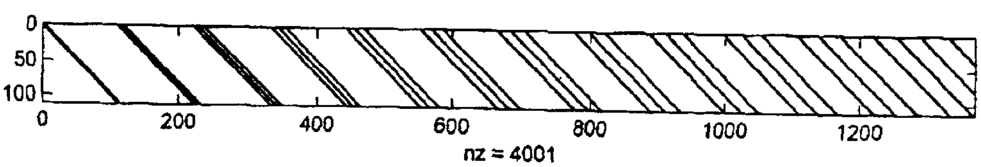
FIG. 12 is an H matrix of size 1369×111 using thirteen sets of three diagonals according to the method of the second embodiment of the invention.

In FIG. 12, an H matrix (size 1369×111) nominally uses thirteen sets of three diagonals according to the method of the second embodiment of the invention. The last (thirteenth) set of diagonals of the H matrix of FIG. 12 contains only one diagonal as the remaining two diagonals are generated beyond the boundaries of the matrix.

Figure 13:
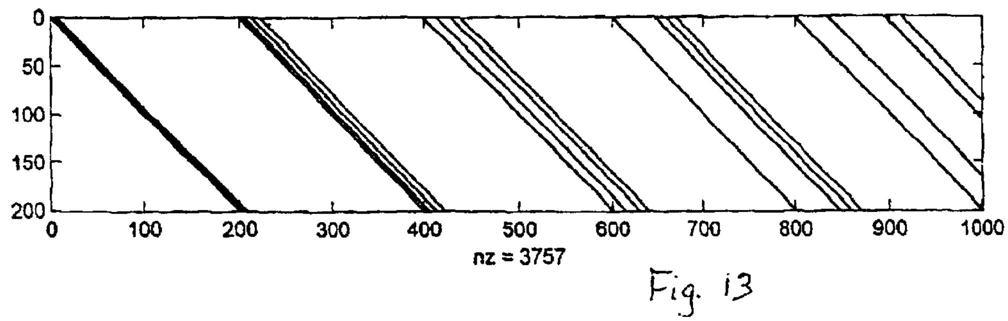
FIG. 13 is an H matrix of size 1000×200 using five sets of four diagonals according to the method of the second embodiment of the invention.

Turning now to FIG. 13, an H matrix (size 1000×200) is seen using five sets of four diagonals according to the method of the second embodiment of the invention. Where $N_j$=4, according to the results of Matlab program, the points of the second diagonals are shifted by 1, 5, 14, 47, and 35 columns relative to the first diagonals; the points of the third diagonals are shifted by 3, 13, 29, 59, and 95 columns relative to the first diagonals, and the points of the fourth diagonals are shifted by 7, 22, 39, 70 and 113 columns relative to the first diagonals.

According to the second embodiment of the invention, since the H-matrix may be determined easily and deterministically, various options exist for transmitting H-matrix information from one modem to another. In a preferred arrangement, since most modems will typically make use of only a few LDPC codes (e.g., 276,69; 529,69; 1369,111), the sequence or a program (or appropriate variables) for generating the sequence for each used LDPC code may be stored, e.g., at the receiver, and then the transmitting modem can simply transfer an indication of the code being used. For example, if all codes utilize $N_j$=3, either two variables (1+3*i and 2+3*i, or 1+3*i and 3+6*i), or a multiplicity of shift values 1, 4, 7, 10, 13, 16 . . . for the second diagonals, and 3, 9, 15, 21, 27, 33 . . . for the third diagonals shift may be stored at the receiver. Upon receiving the $M_k$ and $M_j$ values, the H matrix is then generated accordingly. Where LDPC codes using different $N_j$ values are permitted, it may be possible to store variables for each different $N_j$ possibility. For example, a first variable 1+i is stored for $N_j$=2, while second variables 1+3*i and 2+3*i, or 1+3*i and 3+6*i are stored for $N_j$=3. Alternatively, different sets of shift values may be stored, or code such as provided above may be stored and used to generate the shift values as long as the receiver and transmitter are utilizing the same code.

In another arrangement, both the matrix size and the diagonal column-displacement sequences can be transmitted. In a third arrangement, both the matrix size and the algorithm by which the diagonal column-displacement sequence is generated are transmitted from the transmitter of one modem to the receiver of another modem, or vice versa.

Those skilled in the art should appreciate that by providing a completely diagonal H matrix as disclosed with reference to the preferred second embodiment of the invention, it may be possible to encode bits without the use of a generation matrix. In particular, encoding procedures based on generation matrix utilization require considerable amounts of computation and memory for saving the generation matrix which, unlike the H matrix, is not a sparse matrix. So, attempts at finding other efficient encoding algorithms have been undertaken. For example, a new encoding algorithm for LDPC code has been proposed by IBM in "G.gen:G.dmt.bis:G.Lite.bis: Efficient encoding of LDPC codes for ADSL", ITU—Telecommunication Standardization Sector, Document SC—, San Francisco, Calif., 6–10 Aug. 2001, which is hereby incorporated by reference herein in its entirety. According to the IBM algorithm, LDPC encoding is achieved directly from the parity-check matrix H without need to compute the generation matrix of the code. However, implementation of the IBM algorithm is practical only for specific triangularized H matrices. In the IBM document, a triangularized H matrix is designed by replacing with zeros the lower-triangular elements of the H matrix. Then, parity bits are obtained by the proper recursive procedure from information bits via utilization of the H matrix itself. The procedure described in the IBM document takes advantage of the triangular structure of the H matrix as well as of its sparsity.

Because the completely diagonal H matrix of the second embodiment of the invention is triangularized, the H matrix of the second embodiment of the invention can be used for any type of encoding procedures; i.e., with utilization of the generation matrix G or without it. In addition, it should be appreciated that the completely diagonal structure of the H matrix of the second embodiment of the invention simplifies the computation of the generation matrix because the diagonals guarantee the existence of the corresponding inverse matrix.

There have been described and illustrated herein embodiments of modems utilizing LDPC coders based on particular H matrices, and methods of simply generating such H matrices. While particular embodiments of the invention have been described, it is not intended that the invention be limited thereto, as it is intended that the invention be as broad in scope as the art will allow and that the specification be read likewise. Thus, while particular code has been listed for generating H matrices, it will be appreciated that other software and/or hardware could be utilized. Also, while the H matrix was discussed with reference to a particular DSL-type modem, it will be appreciated that the H matrix could be used in other types of modems (e.g., wireless) or in other applications. Further, while particular preferred conventions were described with respect to one embodiment of the invention, it will be appreciated that other conventions could be added or substituted. For example, while a "bottom-up" and a "top-down" convention were described, a "middle-out" convention could be utilized. Similarly, while the convention of causing the descendant to be located in a row one position down or up from the ancestor of the previous column is preferred, a diagonal can be likewise generated by causing the descendant to be located two, three or n rows up or down from the ancestor of the previous column. In addition, the convention utilized to generate the descendants could change, by convention, from column to column. Furthermore, while rectangle elimination is shown in FIG. 3 to be conducted upon placement of each "1" value in the matrix, it will be appreciated that no checking is required for the first few columns which in principle cannot create a rectangle. Also, while FIG. 3 represents checking for rectangle elimination after each placement of a "1", it is equivalently possible (and is in fact shown in the Matlab program described above) to determine in advance for each column, into which rows a "1" value cannot be placed due to the rectangle rule. Thus, many equivalent flow charts such as FIG. 3 may be generated which represent methods of generating an H matrix according to the invention. Further yet, while the first embodiment of the invention was described as generating a matrix by inserting "1" values into a first column of the matrix and assigning descendant ones in subsequent columns, it will be appreciated that the "1" values could be inserted from left to right, or from right to left in the matrix, and the first column to received the ones could be any column of the matrix. Where, a middle column is selected as the first column to receive the ones, the first and last columns will be perceived to be adjacent each other for purposes of continuing the assignment of descendant ones.

Also, with respect to the second embodiment of the invention it will be appreciated that while particular code has been provided to generate column distances between diagonals, it will be appreciated that other code could be used, and that other unique sets of column distances may also be generated which will avoid generation of rectangles. It will also be appreciated that rather than providing diagonals which start at matrix points H(1,k) and continue diagonally downward, the diagonals could start at matrix points $H(M_j,k)$ and run diagonally upward. It will therefore be appreciated by those skilled in the art that yet other modifications could be made to the provided invention without deviating from its spirit and scope as so claimed.

What is claimed is:

1. A digital modem, comprising:

a) a digital interface; and b) a transmitter coupled to said digital interface, said transmitter including a low density parity check (LDPC) encoder which generates redundant bits utilizing a substantially deterministically generated H matrix;

c) a receiver coupled to said digital interface, said receiver including a LDPC decoder; and d) means for substantially deterministically generating said H matrix, said H matrix having a plurality of columns ($M_k$) and a plurality of rows ($M_j$), said means for generating said H matrix being associated with at least one of said transmitter and said receiver and including means for assigning a plurality of “ones” in a diagonal fashion within said H matrix so as to generate a plurality of diagonals of “ones” while not creating any rectangles of ones in said H matrix, wherein column distances between any two pairs of said plurality of diagonals are unique.

2. A modem according to claim 1, wherein:

said plurality of diagonals of ones include N sets of diagonals, where N is an integer greater than one.

3. A modem according to claim 2, wherein:

said plurality of sets each include a number $N_j$ of diagonals equal to a required number of ones in a column.

4. A modem according to claim 3, wherein:

said plurality of sets comprises N sets where $N=ceil(M_k/M_j)$, where $M_k$ is the number of columns in said H matrix, $M_j$ is the number of rows in said H matrix, and ceil is an indication of rounding-up to the next whole number.

5. A modem according to claim 2, wherein:

a first diagonal in each of said plurality of sets begins from a point with coordinates H(1, k), where $k=(1+(i*M_j))$ and where i an index of set number (i=0,1,2, . . . N−1) and is the number of rows in said H matrix.

6. A modem according to claim 4, wherein:

when $N_j=2$ the points of the second diagonals in each set are shifted 1+i columns relative to the points of the first diagonals where i is an index of set number.

7. A modem according to claim 3, wherein:

when $N_j=2$ the points of the second diagonal in a first set are located one column away from said points of the first diagonal in said first set, and the points of the second diagonal in a second set are located two columns away from said points of the first diagonal in said second set, and the points of the second diagonal in a third set are located five columns away from said points of the first diagonal in said third set, and the points of the second diagonal in a fourth set are located nine columns away from said points of the first diagonal in said fourth set.

8. A modem according to claim 3, wherein:

when $N_j=3$ the points of respective second diagonals of respective of said sets are located 1+(3*i) columns away relative to the points of the first diagonals of respective of said sets, and the points of the third diagonals of said sets are located 2+(3*i) columns away relative to the points of the respective second diagonals of said set, where i is an index of set number.

9. A modem according to claim 1, wherein:

said LDPC encoder generates redundant bits utilizing a generation matrix which is a function of said substantially deterministically generated H matrix.

10. A modem according to claim 1, wherein:

said LDPC encoder generates redundant bits directly via use of said substantially deterministically generated H matrix.

11. A modem according to claim 1, further comprising:

memory means for storing a plurality of column distance sequences for a plurality of H matrices of different sizes.

12. A modem according to claim 1, further comprising:

memory means for storing an algorithm which generates column distance sequences for a plurality of H matrices of different sizes.

13. A method comprising:

generating an H matrix for a low density parity check code by assigning a plurality of “ones” into an H matrix in a completely diagonal fashion with said H matrix having a plurality of columns ($M_k$) and a plurality of rows ($M_j$) such that said “ones” form a plurality of diagonals and column distances between any two pairs of said plurality of diagonals are unique;

generating an encoded data stream based upon said H matrix; and outputting said encoded data stream for transmission over a channel.

14. A method according to claim 13, wherein:

said plurality of diagonals comprises a plurality of N sets of diagonals, where N is an integer greater than one.

15. A method according to claim 14, wherein:

$N=ceil(M_k/M_j)$, and ceil is an indication of rounding-up to the next whole number.

16. A method according to claim 14, wherein:

said N sets of diagonals each include a number $N_j$ of diagonals equal to a required number of ones in a column.

17. A method according to claim 14, wherein:

a first diagonal in each of said plurality of sets begins from a point with coordinates H(1,k), where $k=(1+(i*M_j))$ and where i an index of set number (i=0,1,2, . . . N−1).

18. A method according to claim 16, wherein:

when $N_j=2$ the points of the second diagonals in each set are shifted 1+i columns relative to the points of the first diagonals where i is an index of set number.

19. A method according to claim 16, wherein:

when $N_j=2$ the points of the second diagonal in a first set are located one column away from said points of the first diagonal in said first set, and the points of the second diagonal in a second set are located two columns away from said points of the first diagonal in said second set, and the points of the second diagonal in a third set are located five columns away from said points of the first diagonal in said third set, and the points of the second diagonal in a fourth set are located nine columns away from said points of the first diagonal in said fourth set.

20. A method according to claim 16, wherein:

when $N_j=3$ the points of respective second diagonals of respective of said sets are located 1+(3*i) columns away relative to the points of the first diagonals of respective of said sets, and the points of the third diagonals of said sets are located 2+(3*i) columns away relative to the points of the respective second diagonals of said set, where i is an index of set number.

* * * * *